(12) United States Patent
Topp

(10) Patent No.: US 6,384,474 B1
(45) Date of Patent: May 7, 2002

(54) HOUSING FOR RECEIVING A PLANAR POWER TRANSISTOR

(75) Inventor: Rainer Topp, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/486,869

(22) PCT Filed: Aug. 11, 1998

(86) PCT No.: PCT/DE98/02295

§ 371 Date: Jun. 1, 2000

§ 102(e) Date: Jun. 1, 2000

(87) PCT Pub. No.: WO99/13508

PCT Pub. Date: Mar. 18, 1999

(30) Foreign Application Priority Data

Sep. 6, 1997 (DE) .......................................... 197 39 083

(51) Int. Cl.⁷ .............................................. H01L 23/06
(52) U.S. Cl. ........................ 257/684; 257/687; 257/690; 257/708; 257/712; 257/717; 257/730
(58) Field of Search ............................ 257/666, 674, 257/675, 676, 669, 670, 672, 708, 712, 717, 730, 684, 687, 690

(56) References Cited

U.S. PATENT DOCUMENTS

| | | | | |
|---|---|---|---|---|
| 3,534,233 A | * | 10/1970 | Long | 317/234 |
| 5,297,001 A | * | 3/1994 | Sterling | 361/717 |
| 5,767,578 A | * | 6/1998 | Chang et al. | 257/717 |

FOREIGN PATENT DOCUMENTS

| | | |
|---|---|---|
| DE | 43 27 309 | 2/1994 |
| EP | 0 122 431 | 10/1984 |
| EP | 0 516 416 | 12/1992 |
| EP | 0 694 964 | 1/1996 |

\* cited by examiner

*Primary Examiner*—Douglas Wille
*Assistant Examiner*—Wai-Sing Louie
(74) *Attorney, Agent, or Firm*—Kenyon & Kenyon

(57) ABSTRACT

With a housing for accommodating a planar power transistor, a chip of the power transistor is arranged hermetically sealed inside the housing, and metallized areas on the chip lead out of the housing by way of electric terminals. At least in some areas, the housing is formed by at least one of the electric power terminals.

11 Claims, 1 Drawing Sheet

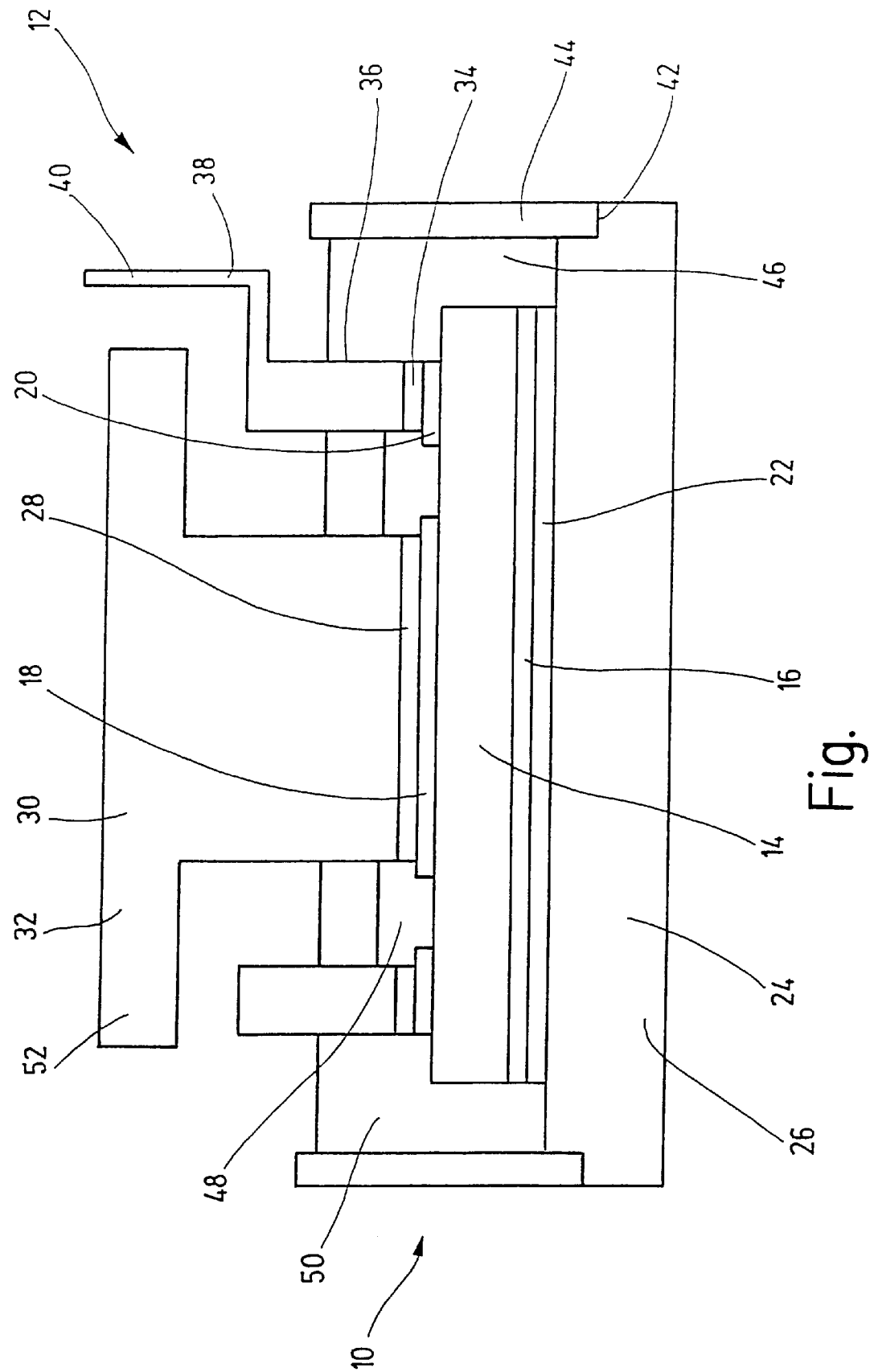

HOUSING FOR RECEIVING A PLANAR POWER TRANSISTOR

FIELD OF THE INVENTION

The present invention relates to a housing for accommodating a planar power transistor having the features characterized in planar power transistor.

BACKGROUND INFORMATION

It is conventional for power transistors to be arranged hermetically sealed in housings. Planar power transistors have a chip where the functionally doped zones can be contacted by metallized areas. The metallized areas are connected to electric terminals that lead out of the housing for linking the power transistor to a circuit arrangement. Power transistors have three terminals that function as a gate electrode and for connecting to a positive voltage potential and a negative voltage potential.

German Published Patent Application No. 43 27 309 describes that a power. transistor can be arranged in a power transistor package, with the power transistor being arranged in a cast plastic housing, which is electrically insulated. One disadvantage here is that there must be optimum dissipation of the heat generated due to power loss in the power transistor through the plastic housing and/or the relatively small electric terminals. Thus, there are considerable limits to the dissipation of the power loss heat.

SUMMARY OF THE INVENTION

The housing according to the present invention, offers the advantage that it permits optimum dissipation of power loss heat generated by a chip in the power transistor. Due to the fact that the housing is formed at least in some areas by at least one of the electric terminals, it is advantageously possible to provide large-area contact over which heat can be dissipated. In addition, the at least one of the electric terminals forming part of the housing may be used to advantage at the same time for assembly of the entire power transistor. Thus, a mechanical and electrically conducting connection of the power transistor to a component carrying a positive and/or negative voltage potential is possible by way of this electric terminal. In particular, it is advatageous if press-fit assembly of the power transistor in a component is possible by way of the electric terminal of the power transistor.

BRIEF DESCRIPTION OF THE DRAWING

The FIGURE schematically shows a sectional view through a power transistor arranged in a housing according to the present invention.

DETAILED DESCRIPTION

The FIGURE shows a schematic sectional diagram of a power transistor 12 arranged in a housing 10. Power transistor 12 has a planar chip 14, which is structured in a manner not considered in further detail here. Chip 14 has a back-side metallized area 16, a first front-side metallized area 18 and a second front-side metallized area 20. Metallized areas 16, 18 and 20 provide the electric connection of the areas structured in chip 14, i.e., for example, the collector, the emitter and the base or the drain, the source and the gate.

Metallized areas 16 and 18 are connected to the power terminals, i.e., a positive voltage potential and/or a negative voltage potential. Metallized area 20 is for the gate electrode, i.e., the base or the gate.

Back-side metallized area 16 is applied to a base 24 with a soft solder 22. Base 24 is made of an electrically conducting material and forms an electric terminal 26 for metallized area 16 of chip 14.

Metallized area 18 is connected to a head carrier 30 by a soft solder 28. Head carrier 30 is also made of an electrically conducting material and forms an electric terminal 32 for metallized area 18 of chip 14.

Finally, metallized area 20 is connected by a soft solder 34 to a ring element 36 that has a terminal lug 38 projecting away radially to an imaginary vertical line passing through housing 10. Ring element 36 and terminal lug 38 are made of an electrically conductive material and form an electric terminal 40 for metallized area 20 of chip 14.

On its outer circumference, base 24 forms a ring groove 42 to lead through a sleeve 44. Sleeve 44 is, for example, glued, soldered or otherwise suitably secured in ring groove 42. Sleeve 44 may be made of an electrically conductive material or an electrically insulating material, depending on the interconnection of power transistor 12 in a circuit arrangement. The arrangement of sleeve 44 forms an interior space 46 in which chip 14 having metallized areas 16, 18 and 20 is arranged. A gap between metallized areas 18 and 20 is filled with an insulating enamel 48. Remaining interior space 46 is filled with a casting compound 50 that hermetically seals chip 14.

Head carrier 30 and ring element 36 together with its terminal lug 38 project out (upward in the view shown here) of housing 10 composed of base 24, sleeve 44 and casting compound 50. Thus, head carrier 30 and terminal lug 38 can be contacted as electric terminals 32 and 40. Base 24 more or less forms the bottom of housing 10 and can also be contacted as electric terminal 26. Head carrier 30 forms a cover of housing 10.

Base 24 forms the entire bottom of housing 10, so that a relatively large area is available for electric terminal 26. Head carrier 30 forms a shield 52, so a large contact area is also available for electric terminal 32. Electric contacting of electric terminals 26 and 32 may be accomplished, for example, by connecting to a component, e.g., a metal plate, having the required voltage potential. Contacting may be accomplished by a solder joint, for example. In addition to a high current carrying capacity of electric terminals 26 and 32, optimum thermal contacting of chip 14 is guaranteed by the large-area contact of electric terminals 26 and 32 on the respective plates responsible for the power supply. Optimum dissipation of the power loss heat of chip 14 is achieved through relatively voluminous base 24 and/or head carrier 30. Furthermore, a relatively large mass is provided due to the relatively voluminous design of base 24 and head carrier 30, providing dynamic thermal protection of chip 14 from external heat sources in addition to good dissipation of the power loss heat. Dissipation of the power loss heat and protection from external thermal energy are provided on both sides of chip 14, thus especially optimum protection is achieved.

Due to the fact that chip 14 is practically encapsulated by base 24 and head carrier 30, power transistor 12 is also suitable for very rugged operation, such as that in circuit arrangements in motor vehicles, for example.

Except for radially projecting terminal lug 38, all parts of power transistor 12 are designed with rotational symmetry, so that mass production is readily possible, because there need not be any special alignment of chip 14 to base 24 and head carrier 30 or ring element 36 and sleeve 44.

According to an embodiment not shown here, base 24 and/or head carrier 30, in particular its shield 52, may be enlarged radially beyond terminal lug 38. Thus, in addition to the possibility of an even more optimized thermal and electric connection of chip 14, entire power transistor 12 together with its housing 10 may be designed for a press-fit assembly in a matching recess in a metal component. This permits use even under extreme temperature and current loads.

What is claimed is:

1. A housing for accommodating a planar power transistor in which a hermetically sealed chip of the planar power transistor is arranged and with metallized areas on the chip being led out of the housing via electric terminals, comprising:

a base forming one of the electric terminals and a bottom of the housing;

a sleeve supported on the base and encompassing the chip in an interior space filled with a casting compound that hermetically seals the chip;

a head carrier forming another of the electric terminals and serving as a cover of the housing and a shield arranged at a distance away from the sleeve, the head carrier being electroconductively coupled by a first solder to a first metallized area of the chip;

a ring element encompassing the head carrier beneath the shield between an outside of the head carrier and the sleeve, the ring element being electroconductively coupled by a second solder to a second metallized area of the chip;

an insulating enamel covered with the casting compound and filling a gap between the first metallized area and the second metallized area; and a terminal lug projecting away from the ring element and forming a gate electrode of the planar power transistor, the terminal lug being led through the distance between the shield and the sleeve, wherein the housing is formed by at least one of the electric terminals.

2. The housing according to claim 1, wherein the base is electroconductively coupled to a third metallized area of the chip.

3. The housing according to claim 1, wherein at least one of each part of the planar power transistor and a set including the base, the sleeve, the head carrier, and the ring element have a rotational symmetry.

4. The housing according to claim 1, wherein at least one of the base and the head carrier projects beyond the terminal lug.

5. The housing according to claim 1, wherein the planar power transistor is capable of being coupled to a component having at least one of a positive voltage potential and a negative voltage potential by at least one of the base and the head carrier in accordance with a press-fit assembly.

6. A semiconductor component corresponding to a housing in which a hermetically sealed chip of a power transistor is arranged and with metallized areas on the chip being led out of the housing via electric terminals, comprising:

a base forming one of the electric terminals and a bottom of the housing;

a sleeve supported on the base and encompassing the chip in an interior space filled with a casting compound that hermetically seals the chip;

a head carrier forming another of the electric terminals and serving as a cover of the housing and a shield arranged at a distance away from the sleeve, the head carrier being electroconductively coupled by a first solder to a first metallized area of the chip;

a ring element encompassing the head carrier beneath the shield between an outside of the head carrier and the sleeve, the ring element being electroconductively coupled by a second solder to a second metallized area of the chip;

an insulating enamel covered with the casting compound and filling a gap between the first metallized area and the second metallized area; and a terminal lug projecting away from the ring element and forming a gate electrode of the power transistor, the terminal lug being led through the distance between the shield and the sleeve.

7. The semiconductor component according to claim 6, wherein the power transistor is planar.

8. The semiconductor component according to claim 6, wherein the base is electroconductively coupled to a third metallized area of the chip.

9. The semiconductor component according to claim 6, wherein at least one of each part of the power transistor and a set including the base, the sleeve, the head carrier, and the ring element have a rotational symmetry.

10. The semiconductor component according to claim 6, wherein at least one of the base and the head carrier projects beyond the terminal lug.

11. The semiconductor component according to claim 6, wherein the power transistor is capable of being coupled to a component having at least one of a positive voltage potential and a negative voltage potential by at least one of the base and the head carrier a set including the base, the sleeve, the head carrier, and the ring element in accordance with a press-fit assembly.

* * * * *